United States Patent [19]

Peterson et al.

[11] Patent Number: 4,694,242
[45] Date of Patent: Sep. 15, 1987

[54] INTEGRATED CIRCUIT TESTER AND REMOTE PIN ELECTRONICS THEREFOR

[75] Inventors: John L. Peterson; Mavin Swapp, both of Mesa, Ariz.

[73] Assignee: Motorola Inc., Schaumburg, Ill.

[21] Appl. No.: 876,661

[22] Filed: Jun. 20, 1986

Related U.S. Application Data

[63] Continuation of Ser. No. 656,810, Oct. 1, 1984, abandoned.

[51] Int. Cl.⁴ ............................................. G01R 31/28
[52] U.S. Cl. ............................. 324/73 R; 324/158 R; 371/20
[58] Field of Search ............ 324/158 R, 73 R, 73 AT, 324/158 F; 371/16, 20; 307/356

[56] References Cited

U.S. PATENT DOCUMENTS 3,555,298  1/1971  Neelands .............................. 307/356
3,564,408  2/1971  Schultz et al. ................... 324/158 F
4,038,599  7/1977  Bove et al. ....................... 324/158 F

OTHER PUBLICATIONS

Schraeder, M. W.; "Multiplexed Measuring . . ."; EDN; May 12, 1982; pp. 187–190.
Faran, Jr.; "Methods of Assignment . . ."; 1982, IEEE Test Conference; May 1982; pp. 641–647.

Primary Examiner—Ernest F. Karlsen
Attorney, Agent, or Firm—Raymond J. Warren

[57] ABSTRACT

The present invention relates, in general, to an electronic and measuirng circuits are located remotely from the test head. A low device count circuit at each pin performs the necessary high speed switching. The force and measure lines are relatively long, but the signal rates are low enough to be accurately transmitted. The only high rate signals are on lines coupled to the gates of FET switches at the test head. Thus, multiple pin, high speed testing can be accomplished using relatively small and inexpensive test heads.

11 Claims, 2 Drawing Figures

INTEGRATED CIRCUIT TESTER AND REMOTE PIN ELECTRONICS THEREFOR

This application is a continuation of application Ser. No. 656,810, filed 10-1-84, now abandoned.

FIELD OF THE INVENTION

The present invention relates, in general, to an electronic apparatus for use at the test head of an automated integrated circuit tester. More particularly, the invention relates to a low device count circuit which allows the forcing and measuring circuits of an automated integrated circuit tester to be located a relatively great distance from the test head.

BACKGROUND OF THE INVENTION

A crucial step in the manufacture of semiconductor integrated circuits is the testing of those circuits at various stages in their manufacture. As integrated circuits become more complex and require more pins for interconnection to circuit boards and the like, the problems of testing those circuits increase dramatically.

A substantial problem in the testing of high pin count integrated circuits is the size of the test head required. Current state of the art automated testers dedicate a forcing and measuring unit which is capable of imposing a number of force conditions and measuring responses, to each pin of the device under test. In order to eliminate signal degradation and other problems it is necessary to locate these force and measure units as close to the pin under test as possible. Therefore, as more capabilities are designed into the force and measure units and the testers are designed to test more pins, the physical size of the test head quickly increases to unmanageable proportions. All of these problems are exacerbated by the increase in speed of current state of the art testers. The resulting high switching rates of the test head make problems of interference and signal quality much more troublesome.

SUMMARY OF THE INVENTION

Accordingly, it is an object of the present invention to provide an improved automated integrated circuit tester.

A further object of the present invention is to provide an improved electronic circuit for use at the test head of an automated integrated circuit tester.

Yet a further object of the present invention is to provide a low device count circuit which allows thehe forcing and measuring units of an automated integrated circuit tester to be located remotely from the test head.

These and other objects and advantages are provided by an integrated circuit tester having force and measure units remote from the test heads. Switching devices at the test heads close to the pins under test provide high speed switching between various test conditions. More than one forcing circuit is used so that the signals on the lines coupling the force circuits to the test head may be switched at a much lower rate than is apparent to the pins under test.

These and other objects and advantages of the present invention will be apparent to ones skilled in the art from the detailed description below taken together with the drawings.

DETAILED DESCRIPTION OF THE INVENTION

Figure 1:
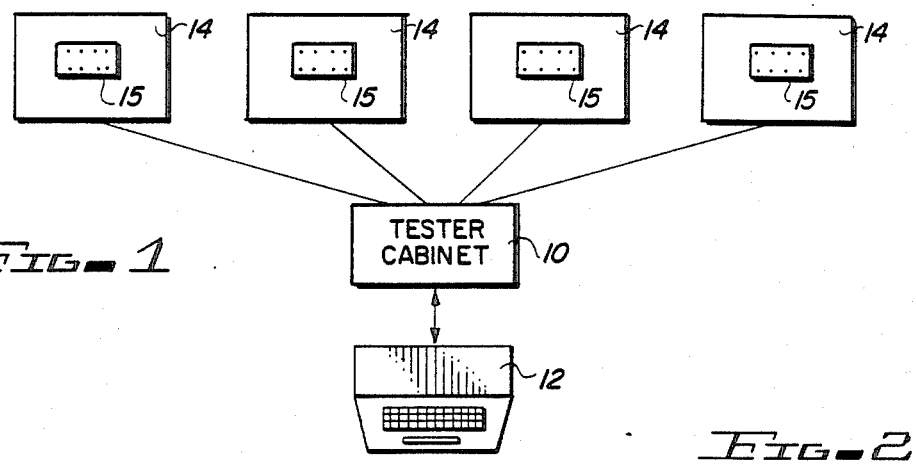
FIG. 1 is a block diagram illustrating an integrated circuit tester.

FIG. 1 is a simplified block diagram illustrating a typical integrated circuit tester. Most of the components of the tester are housed in a cabinet 10. Those components housed in cabinet 10 typically include the basic control structures of the tester and to outside computers. The tester architecture may be of the type described in co-pending application Ser. No. 656,812, filed of even date herewith, now U.S. Pat. No. 4,604,744, assigned to the assignee of the present application. Typically, one or more operator interface console 12 are provided coupled to tester cabinet 10. The actual testing takes place at one or more test heads 14 coupled to tester cabinet 10. Each test head 14 includes a socket 15 used to couple the device under test to the test electronics. Other means of means of providing this coupling, such as probers, are also familiar in the art.

In high speed, multi-pin integrated circuit testers, it has been found necessary to locate a relatively large portion of the forcing and measuring circuitry necessary to accomplish the testing in test heads 14. This is necessary to avoid interference, timing and other problems. In order to perform high speed integrated circuit testing it is necessary to accurately time edges of pulses, accurately measure relatively small currents and voltages and rapidly switch between states, among others. Achieving these goals over long lines is particularly difficult. The most common solution is to shorten the lines by placing the force and measure circuits close to the pins of the device under test. As the complexity of the tests to be performed and the number of pins has increased, the size of test heads 14 and their resulting cost has increased dramatically.

Figure 2:
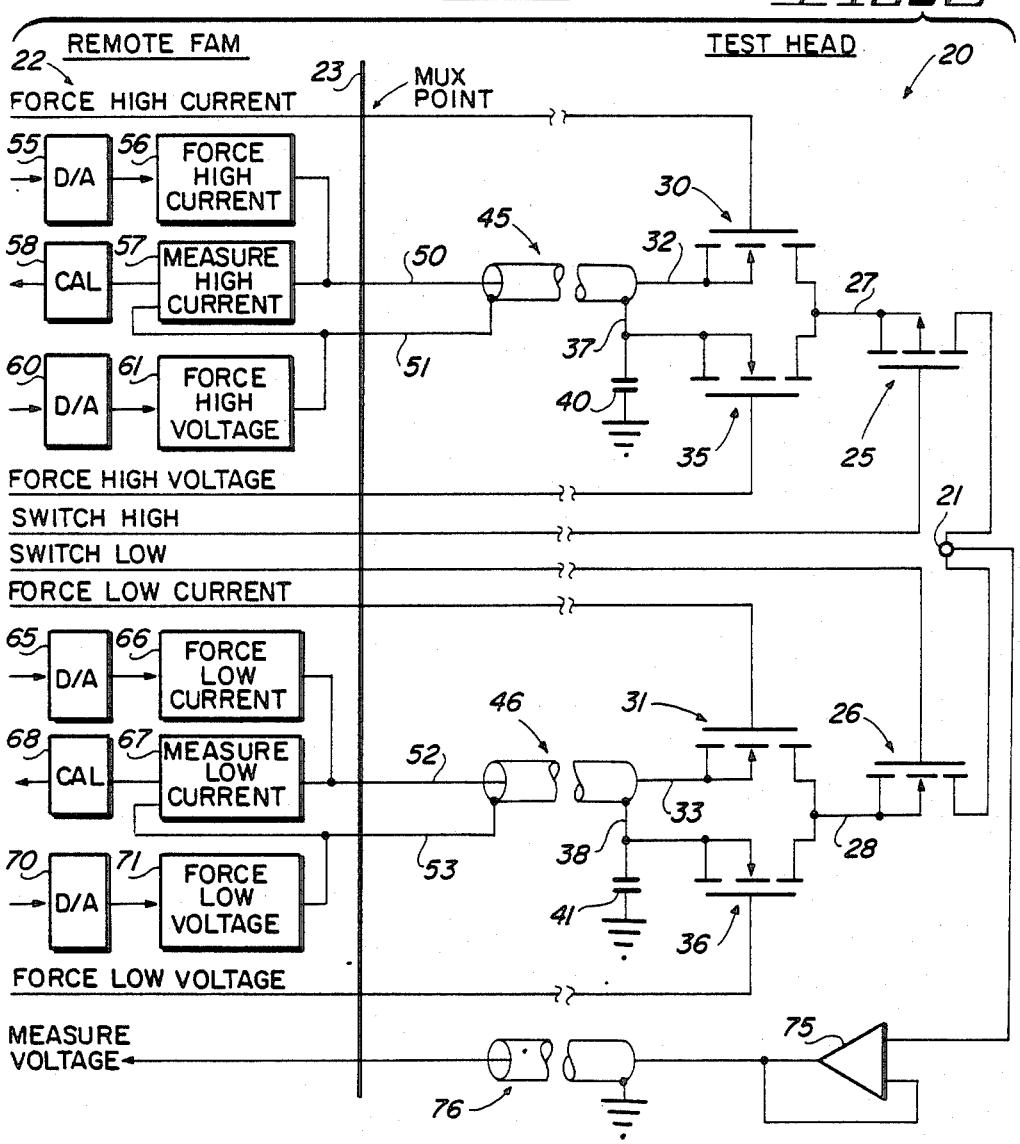
FIG. 2 is a detailed block diagram illustrating a portion of an integrated circuit tester according to the principles of the present invention.

FIG. 2 is a detailed block diagram illustrating a particular embodiment of the present invention. In the present invention, a low device count circuit 20 at the test head couples each pin 21 of the device under test to a force and measure (FAM) unit 22, which may be located up to approximately 10 feet from the test head. Circuit 20 is repeated for each pin 21 of the socket or prober at the test head. Remote FAM 22 can be located within the same enclosure as the remainder of the tester or anywhere else that is convenient. As is typical, remote FAM 22 is multiplexed to number of test heads at multiplexer point 23.

In the particular embodiment of the invention shown in FIG. 2, remote FAM 22 is capable of forcing and measuring both current and voltage over two ranges, a high range and a low range. A first pair of field effect transistors, or FET's, 25 and 26 are used to switch between the high range forcing and measuring circuits and the low range forcing and measuring circuits, respectively. A gate of FET 25 is connected to a switch high line from remote FAM 22. A drain of FET 25 is connected to pin 21. A source of FET 25 is connected to high range force and measure line 27. As is familiar in the art, the gate of an FET controls conductivity between the source and the drain. Therefore, remote FAM 22 can selectively couple and decouple high range force and measure line 27 to pin 21 via FET 25. A gate of FET 26 is connected to a switch low line from remote FAM 22. A drain of FET 26 is coupled to pin 21. A source of FET 26 is connected to low range force and measure line 28. Therefore, remote FAM 22 can selectively couple and decouple low range force and measure line 28 to pin 21 via FET 26.

FET's 25 and 26 are used as high speed switches between the high and low force and measure ranges of remote FAM 22. The voltage gain available from these devices permits relatively fast switching of the low speed signals on lines 27 and 28. FET's 25 and 26, and each of the other FET's discussed below are preferably very low capacitance devices. This is because the capacitance limits the switching speed. Of particular use in this regard are VMOS devices available from a number of discrete semiconductor suppliers.

A second pair of FET's 30 and 31 are used to control the coupling of the current forcing and measuring circuits to pin 21. A gate of FET 30 is connected to a force high current line from remote FAM 22. A drain of FET 30 is connected to high range force and measure line 27. A source of FET 30 is connected to high range current force and measure line 32. Therefore, remote FAM 22 can control, via its force high current line and FET 30, the coupling of high current force and measure line 32 to high range force and measure line 27.

Similarly, a gate of FET 31 is connected to a force low current line from remote FAM 22. A drain of FET 31 is connected to low range force and measure line 28. A source of FET 31 is connected to low range current force and measure line 33. Therefore, remote FAM 22, through its force low current line and FET 31 can control the coupling of low current force and measure line 33 to low range force and measure line 28.

In addition to functioning as simple switches, FET's 30 and 31 act as common gate impedance converters for current forcing. In other words, FET's 30 and 31 are operated as active devices when forcing current rather than being operated as saturated switches. This provides that lines 32 and 33 "see" a high impedance at FET's 30 and 31, respectively, and that lines 27 and 28 "see" a low impedance.

A third pair of FET's 35 and 26 are used to control the voltage forcing pathways. A gate of FET 35 is connected to a force high voltage line of remote FAM 22. A drain of FET 35 is connected to high range force and measure line 27. A source of FET 35 is connected to a high range voltage forcing line 37. Therefore, remote FAM 22, via its force high voltage line and FET 35, can control the coupling of high range voltage forcing line 37 to high range force and measure line 27.

A gate of FET 36 is connected to a force low voltage line from remote FAM 22. A drain of FET 36 is connected to low range force and measure line 28. A of FET 36 is connected to low range voltage forcing line 38. Therefore, remote FAM 22, via its force low voltage line and FET 36, can control the coupling of low range voltage forcing line 38 to low range force and measure line 28.

In addition to acting as switches, FET's 35 and 36 include parasitic diodes which function as voltage compliant clamps when forcing current. A further function of FET's 35 and 36 is to speed up very low level current measuring. This measurement has typically been slow because of the time required to charge up all the stray capacities between the pin and the measuring device at low current levels. When measuring current with the present invention. FET 35 or 36, as is appropriate, is made conductive briefly at the start of the test. This provides a low impedance pathway to charge all the capacities very quickly, then the FET 35 or 36 is made non-conductive and the actual measurement takes place.

A capacitor 40 is connected between high range voltage forcing line 37 and ground in order to reduce the AC impedance of the line. Similarly a capacitor 41 is connected between low range voltage forcing line 38 and ground.

A pair of coaxial cables 45 and 46 couple the high and low range forcing and measuring circuits, respectively, to the FET switches. Other transmission line devices, such as shielded ribbon cables, may be used in place of coaxial cable. A center conductor of coaxial cable 45 is connected at one end to high range current force and measure line 32 and at the other end to line 50 entering remote FAM 22. An outer, or shield, conductor of coaxial cable 45 is connected at one end to high range voltage forcing line 37 and at the other end to line 51 entering remote FAM 22. Similarly, a center conductor of coaxial cable 46 is connected at one end to low range current force and measure line 33 and at the other end to line 52 entering remote FAM 22. An outer, or shield, conductor of coaxial cable 46 is connected at one end to low range voltage forcing line 38 and at the other end to line 53 entering remote FAM 22.

A digital word corresponding to an analog value of current to be forced utilizing the high range current forcing circuits is passed from other portions of the tester to digital-to-analog converter 55. Once converted, the analog value is passed to force high current circuit 56. Force high current circuit 56 is simply a programmable current source. Circuit 56 "forces" the current value specified by the tester as received from converter 55. The output of force high current circuit 56 is connected to line 50 and thence to the center conductor of coaxial cable 45. As long as FET's 25 and 30 are conductive, as determined by the switch high line and the force high current line, the current forcing condition specified by force high current circuit 56 will be applied to pin 21. Line 50 entering remote FAM 22 is also connected to high current measuring circuit 57. High current measuring circuit 57 also receives a reference input from line 51, which is connected to the outer conductor of coaxial cable 45. The output of high current measuring circuit 57 is connected, through calibrator 58, to the high current measuring circuits of the tester.

A voltage forcing condition to be applied to pin 21 via the high range forcing circuits is passed digitally to digital-to-analog converter 60. Once converted, the analog signal is passed to force high voltage circuit 61. Force high voltage circuit 61 is a programmable voltage source. Circuit 61 "forces" the voltage value specified. The output of force high voltage circuit 61 is connected to line 51 and thence to the outer conductor of coaxial cable 45. As long as FET's 25 and 35 are conductive, the voltage forcing conditions specified by force high voltage circuit 61 will be applied to pin 21.

The low range force and measure circuitry parallels that just described for the high range. Low range current forcing conditions are connected to digital-to-analog converter 65 and thence to force low current circuit 66. The output of force low current circuit 66 is connected to line 52 and thence to the center conductor of coaxial cable 46. Low range current measuring is accomplished by means of low current measuring circuit 67, which receives inputs from lines 52 and 53 and passes its output through calibrator 68. FET's 26 and 31 must be conductive for low range current forcing and measuring to take place.

Low range voltage forcing conditions are connected to digital to analog converter 70 and thence to force low voltage circuit 71. The output of force low voltage circuit 71 is connected to line 53 and thence to the outer conductor of coaxial cable 46. FET's 26 and 36 must be conductive for the voltage forcing in the low range to occur.

Voltage sensing at pin 21 is accomplished by means of a follower amplifier 75 which has one input connected to pin 21 and the other input connected to its own output. The output of voltage follower 75 is connected through the center conductor of coaxial cable 76 to the voltage measuring circuitry of remote FAM 22. The outer conductor of coaxial cable 76 is grounded.

The combination of several force and measure units and the circuit described above provides for high speed testing of integrated circuits with a low cost test head. All switching is accomplished by means of lines coupled to the gates of low capacitance FET's, thereby decreasing the importance of line length. In addition, the ability to quickly measure low current levels is provided. In the preferred embodiment described above, the high range FET's are on one channel type (P channel) while the low range FET's are of the opposite channel type (N channel). This is useful if, for instance, it is desired to force and measure positive current and voltage with the high range circuits and negative current and voltage with the low range circuits.

But now it should be apparent that an improvement in automated integrated circuit testers is offered by the present invention. Through the use of more than one force and measure circuit per pin and high input impedance switches at the pin, high switching rate tests may be performed. The force and measure units are removed from the test head and replaced by a low device count circuit at each pin which provides high speed switching and compensates for the long lines to the force and measure units. Test head cost is thereby reduced.

We claim:

1. In an apparatus for providing an interface between an integrated circuit tester, comprising a current between an integrated circuit tester and a pin of a device under test, said apparatus comprising means for forcing current, means for forcing voltage, means for measuring current and means for measuring voltage, the improvement comprising;
    first switch means for selectively coupling and decoupling said integrated circuit tester to said pin;
    second switch means for selectively coupling and decoupling said means for forcing current of said integrated circuit tester to said first switch means; and
    third switch means for selectively coupling and decoupling said means for forcing voltage of said integrated circuit tester to said first switch means.

2. An apparatus according to claim 1 wherein said voltage portion of said integrated circuit tester further comprises a voltage measuring portion, said apparatus further comprising:
    means for coupling said pin to said means for measuring voltage of said integrated circuit tester independent of said first switch means.

3. An apparatus according to claim 1 wherein: said first switch means further comprises at least one FET having a gate controlled by said integrated circuit tester, a drain coupled to said pin and a source.

4. An apparatus according to claim 3 wherein:
    said second switch means further comprises at least one FET having a gate controlled by said integrated circuit tester, a drain coupled to said source of said first switch means and a source coupled to said integrated circuit tester.

5. An apparatus according to claim 4 wherein:
    said third switch means further comprises at least one FET having a gate controlled by said integrated circuit tester, a drain coupled to said source of said first switch means and a drain coupled to said integrated circuit tester.

6. In an apparatus for providing an interface between an integrated circuit tester and a pin of a device under test, said apparatus comprising means for forcing current, means for forcing voltage, means for measuring current and means for measuring voltage, the improvement comprising:
    at least one first FET switch having a gate controlled by said integrated circuit tester, a drain coupled to said pin and a source;
    at least one second FET switch having a gate controlled by said integrated circuit tester, a drain coupled to said source of said at least one first FET switch and a source coupled to said means for forcing current; and
    at least one third FET switch having a gate controlled by said integrated circuit tester, a drain coupled to said source of said at least one first FET switch and a source coupled to said means for forcing voltage.

7. An apparatus according to claim 6 further comprising:
    means for coupling said pin to said means for measuring voltage of said integrated circuit tester.

8. An apparatus according to claim 6 wherein:
    said source of said at least one second FET switch is also coupled to said means for measuring current of said integrated circuit tester.

9. An apparatus according to claim 6 wherein:
    said source of said at least one third FET switch is also coupled to said means for measuring current of said integrated circuit tester.

10. An apparatus for providing an interface between an integrated circuit tester, comprising a high range portion and a low range portion with each portion having means for forcing current, means for forcing voltage, means for measuring current and means for measuring voltage, and a pin of a device under test, said apparatus comprising:
    a first FET switch having a gate coupled to said integrated circuit tester, a drain coupled to said pin, and a source;
    a second FET switch having a gate coupled to said integrated circuit tester, a drain coupled to said pin, and a source;
    a third FET switch having a gate coupled to said integrated circuit tester, a drain coupled to said source of said first FET, and a source coupled to said means for forcing current and to said means for measuring current of said high range portion;
    a fourth FET switch having a gate coupled to said integrated circuit tester, a drain coupled to said source of said second FET, and a source coupled to said means for forcing current and to said means for measuring current of said low range portion;

a fifth FET switch having a gate coupled to said integrated circuit tester, a drain coupled to said source of said first FET, and a source coupled to said means for forcing voltage and to said means for measuring current of said high range portion; and a sixth FET switch having a gate coupled to said integrated circuit tester, a drain coupled to said source of said second FET, and a source coupled to said means for forcing voltage and to said means for measuring current of said low range portion.

11. An apparatus according to claim 10 further comprising:

a voltage follower amplifier coupling said pin to said means for measuring voltage of said integrated circuit tester.

* * * * *